United States Patent
Hagi

[19]

[11] Patent Number: 5,859,478
[45] Date of Patent: Jan. 12, 1999

[54] SEMICONDUCTOR DEVICE INCLUDING A MAIN ALIGNMENT MARK HAVING PERIPHERAL MINUTE ALIGNMENT MARKS

[75] Inventor: Kimio Hagi, Tokyo, Japan

[73] Assignee: Mitsubishi Denki Kabushiki Kaisha, Tokyo, Japan

[21] Appl. No.: 797,447

[22] Filed: Feb. 6, 1997

[30] Foreign Application Priority Data

Aug. 23, 1996 [JP] Japan .................................. 8-222285

[51] Int. Cl.⁶ .................................................. H01L 23/544
[52] U.S. Cl. ........................................... 257/797; 438/401
[58] Field of Search ........................... 257/797; 438/401, 438/462

[56] References Cited

U.S. PATENT DOCUMENTS 5,532,520  7/1996  Haraguchi et al. ...................... 257/797
5,700,732  12/1997  Jost et al. .................................. 438/401

FOREIGN PATENT DOCUMENTS 6-112102  4/1994  Japan .

*Primary Examiner*—Olik Chaudhuri
*Assistant Examiner*—Nathan K. Kelley
*Attorney, Agent, or Firm*—McDermott, Will & Emery

[57] ABSTRACT

In a semiconductor device having alignment marks formed on a semiconductor substrate, the alignment marks include a main convex or concave alignment mark formed on said semiconductor substrate; and a plurality of minute alignment marks formed on the periphery of the main alignment mark. In areas where the minute alignment marks are formed, even when a film of aluminum or its alloy is stacked on the semiconductor substrate by high temperature sputtering, grains will not grow so as to have a large diameter. Thus, the grains created on the periphery of the main alignment mark are not erroneously recognized as the main alignment mark, thereby realizing accurate alignment.

8 Claims, 4 Drawing Sheets

SEMICONDUCTOR DEVICE INCLUDING A MAIN ALIGNMENT MARK HAVING PERIPHERAL MINUTE ALIGNMENT MARKS

BACKGROUND OF THE INVENTION

The present invention relates to a semiconductor device and a method of manufacturing it, and more particularly to a semiconductor device equipped with an alignment mark necessary to make alignment with no error in an alignment step and a method of manufacturing it.

Generally, in a process of manufacturing a semiconductor device, an alignment step must be carried out prior to photo-lithography steps. The alignment step serves to confirm and correct the arrangement of chips on a wafer and make alignment between a reticle and a chip at the step prior to light exposure, thus suppressing misalignment in superposition from occurring.

At present, as a technique of forming a wiring layer of an aluminum alloy, sputtering at a high temperature (hereinafter referred to as high temperature sputtering) is adopted. The high temperature sputtering permits a film of aluminum alloy to be stacked, and can improve coverage for a contact hole formed in an underlying interlayer insulating film and flatten the surface of the stacked aluminum alloy film. This technique is hopeful as a contact hole embedding technique.

As shown in FIG. 7, however, alignment marks 102 formed on a semiconductor device 101 in alignment have been formed as convex or concave quadrilateral each having sides of several $\mu$m. For this reason, when the film of aluminum is made on the semiconductor substrate 101 by the high temperature sputtering, grains each having a large diameter of several $\mu$m are formed as shown in FIG. 8. Therefore, in the subsequent alignment step, the device for alignment may erroneously recognize these grains as the alignment marks and make alignment with an error. When the error in alignment in superposition exceeds a prescribed tolerance that the resultant semiconductor device does not operate properly.

JP-6-112102 discloses alignment marks 102 permitting alignment to be made with no error even after a film is formed on the semiconductor substrate 101 by the high temperature sputtering.

In accordance with the technique disclosed in JP-6-112102, as shown in FIG. 9, an auxiliary pattern 103 covers the outer periphery of the alignment pattern 102 formed according to a prescribed size. For example, where both the alignment pattern 102 and the auxiliary pattern 103 are formed as concave patterns, the material of the film formed by the high temperature sputtering is caused to flow into the concave portion of the auxiliary pattern 103 prior to flowing into the alignment mark 102. Thus, it was possible to suppress the material from being embedded in the concave portion of the alignment mark 102, thereby permitting the contour of a main mark, i.e. alignment mark 102 to be clearly recognized after the high temperature sputtering.

This prior art, however, is silent on misalignment in superposition due to the shape of grains when aluminum and its alloy are formed by the high temperature sputtering. This prior art also leads to erroneous recognition of the alignment mark 102.

SUMMARY OF THE INVENTION

The present invention intends to carry out improved alignment with no recognition error of an alignment mark when a film of aluminum or its alloy is formed by high temperature sputtering, thus improving alignment accuracy.

In order to attain the above object, an alignment mark formed on a semiconductor substrate of a semiconductor device includes a main alignment mark in convex or concave shape and plural minute alignment marks formed on the periphery of the main alignment mark.

Each of the minute alignment patterns formed on the semiconductor substrate of the semiconductor device according to the present invention is a concave or convex pattern of a hole pattern or line-and-space pattern.

The main alignment mark formed on the semiconductor substrate of a semiconductor device according to the present invention is a quadrilateral pattern having several $\mu$m sides. The minute alignment pattern is a pattern having a size of 0.5–2.0 $\mu$m. Each of the minute patterns is a hole or line pattern formed so that the interval between the two adjacent minute patterns is 0.5–2.0 $\mu$m.

Each of the minute alignment marks formed on the semiconductor substrate of a semiconductor device according to the present invention is formed so as to surround outer peripheral four sides of a main alignment mark having a quadrilateral shape.

The semiconductor device according to the present invention is a semiconductor device requiring a step of making a film of aluminum or its alloy by the high temperature sputtering. The alignment mark formed on a semiconductor substrate when the semiconductor device is fabricated includes a main alignment mark and a minute alignment mark surrounding the main alignment mark.

Further, the alignment mark formed on the semiconductor substrate of a semiconductor device according to the present invention includes a main alignment mark formed on the semiconductor substrate and a plurality of minute alignment marks for suppressing grains from being created on the outer periphery of the alignment mark.

The method of manufacturing a semiconductor device according to the present invention includes a step of forming a minute alignment mark as well as a main alignment mark as an alignment mark which is used for alignment at a step prior to making a film of aluminum and its alloy by high temperature sputtering, the minute alignment marks being formed on the outer periphery of the main alignment mark to suppress grains from being created.

In the semiconductor device according to the present invention, since minute patterns are formed on the periphery of each of the alignment marks on the semiconductor substrate, even when the aluminum or aluminum alloy film is stacked on an underlying layer by the high temperature sputtering, in the subsequent alignment step, it is possible to prevent the grains formed on the periphery of the alignment mark from growing to have a large diameter. Thus, the grains will not be erroneously recognized as the alignment mark, thereby permitting accurate alignment.

In the semiconductor device according to the present invention, when the minute alignment patterns formed on the periphery of the alignment mark on the semiconductor substrate are formed as hole patterns or line-and-space patterns, when the aluminum or aluminum alloy is stacked on these areas by the high temperature sputtering, the grains will not grow so as to have a large diameter. Thus, in an alignment step, the grains are not erroneously recognized as the alignment mark, thus allowing accurate alignment.

Further, in accordance with the present, invention, for quadrilateral alignment marks each having several $\mu$m sides, minute alignment marks each having a diameter or width of 0.5–2.0 μm are formed on the periphery of the alignment mark at intervals of 0.5–2.0 μm. In this case, even when a film of aluminum or aluminum alloy is made by the high temperature sputtering, the grains are formed to have a diameter of 0.5 2.0 μm or less on the periphery of the alignment mark. Thus, since there is a large difference in size between the alignment marks and grains formed on the periphery thereof, the alignment mark can be detected accurately, thus suppressing an alignment error due to mask alignment from occurring.

Since minute alignment patterns are formed so as to surround the alignment marks which are at least quadrilateral, accurate alignment can be made.

In the semiconductor device fabricated by the process including a high temperature sputtering step, in making an alignment mark, other minute alignment marks are additionally formed on the periphery of the alignment mark. Thus, it is possible to suppress grains from growing on the periphery of the alignment mark so that in the subsequent alignment step, the grains are not erroneously recognized as the alignment marks, thereby allowing accurate alignment.

Since the minute alignment marks are formed on the periphery of the alignment mark to suppress grains from growing even when the film of aluminum or aluminum alloy is made by the high temperature sputtering, it is possible to suppress an alignment error due to erroneous recognition of the grain as being the alignment mark, thereby allowing accurate alignment.

In accordance with the method of manufacturing a semiconductor device according to the present invention, which includes a step of forming a main alignment mark and a plurality of minute alignment marks, even when the film of aluminum or aluminum alloy is formed by the high temperature sputtering, large grains are not created at the areas where the minute alignment patterns are formed so that the main alignment pattern can be recognized accurately, thereby allowing accurate alignment.

The above and other objects and features of the present invention will be more apparent from the following description taken in conjunction with the accompanying drawings.

DESCRIPTION OF THE PREFERRED EMBODIMENTS

Embodiment 1

In the process of manufacturing a semiconductor device, for example, when wiring of an aluminum alloy is to be patterned on a semiconductor substrate, at least one alignment mark is formed prior to forming a film of aluminum alloy.

After the alignment mark is formed, the aluminum (Al) alloy is stacked on the surface of the semiconductor by high temperature sputtering, a resist coat having a predetermined thickness is formed on the surface of the semiconductor substrate, and thereafter a mask (reticle) drawn in a pattern shape and the alignment mark formed the semiconductor substrate are aligned with each other by movement of a stage on which the semiconductor substrate is placed, thereby completing mask alignment.

The mask is irradiated with light and the resist coat is exposed to light. Thereafter, the resist coat on the semiconductor substrate is developed to form a resist pattern. Using the resist pattern as an etching mask, the aluminum alloy is etched to provide wiring of aluminum alloy having a desired shape. Thus, the wiring of aluminum alloy can be patterned.

Figure 1:
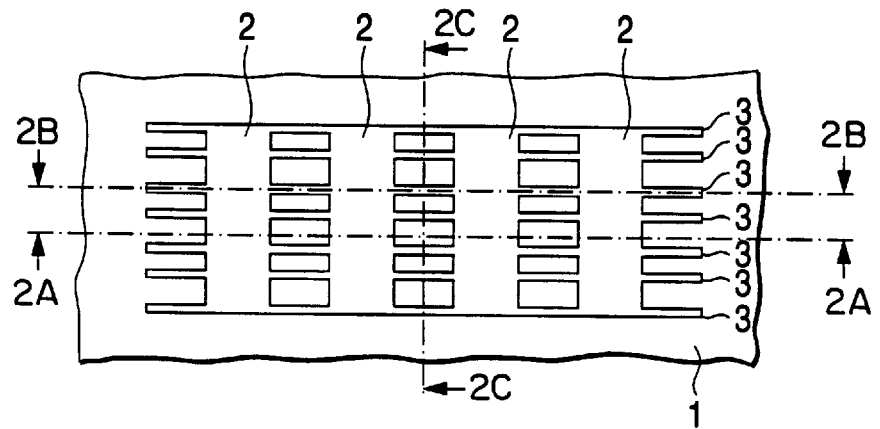
FIG. 1 is a plan view of a semiconductor device according to the first embodiment of the present invention.
Figure 2A:
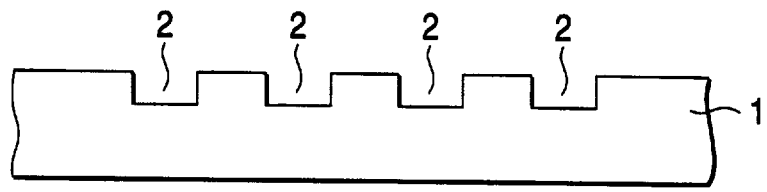
FIGS. 2A, 2B and 2C are plan views of a semiconductor device according to the first embodiment of the present invention, respectively.
Figure 2B:
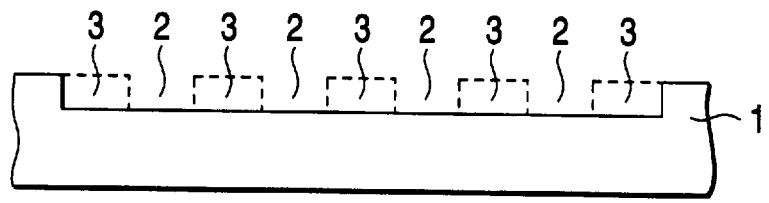
Figure 2C:
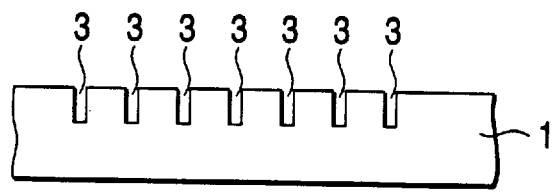

FIG. 1 shows a plan view of an alignment mark formed on the semiconductor substrate according to the first embodiment. FIG. 2A is a sectional view taken on line 2A—2A of FIG. 1. FIG. 2B is a sectional view taken on line 2B—2B in FIG. 1. FIG. 2C is a sectional view taken on line 2C—2C in FIG. 1.

In FIG. 1, reference numeral 1 denotes a semiconductor substrate; and reference numeral 2 denotes one of concave alignment marks each formed so as to have a predetermined size. These alignment marks are main alignment marks (referred to as alignment marks 2) each of which is formed in a quadrilateral shape with sides each having a length of 2.0 μm or more.

On the outer periphery of the alignment mark 2, plural concave line patterns (line-and-space patterns) 3 each having a line width of 0.5–2.0 μm are formed at intervals of 0.5–2.0 μm as minute alignment marks.

FIG. 2A is a sectional view taken on line 2A—2A of FIG. 1, i.e., taken between two line patterns 3 which are adjacent along the arrangement thereof. The main alignment pattern 2 is formed as a concave shape.

FIG. 2B is a sectional view taken on line 2B—2B of FIG. 1, i.e., along the concave portion of the line pattern 3 at the position shifted from the position taken on line 2A—2A of FIG. 1 in a direction of line width of the line pattern 3. The shape in a direction of line length of the line pattern 3 is formed as a concave portion.

FIG. 2C is a sectional view taken on line 2C—2C in FIG. 1, i.e., taken along the line orthogonal to both 2B—2B line and 2C—2C line and crossing the line patterns 3. The concave line patterns 3 each having a line width of 0.5–2.0 μm are formed at intervals of 0.5–2.0 μm on the periphery of each of the concave alignment marks 2.

After the alignment marks 2 as shown in FIG. 1 are formed on the semiconductor substrate 2, the aluminum alloy is stacked on the surface of the semiconductor substrate with the temperature being maintained at 350° C.–550° C.

Figure 3:
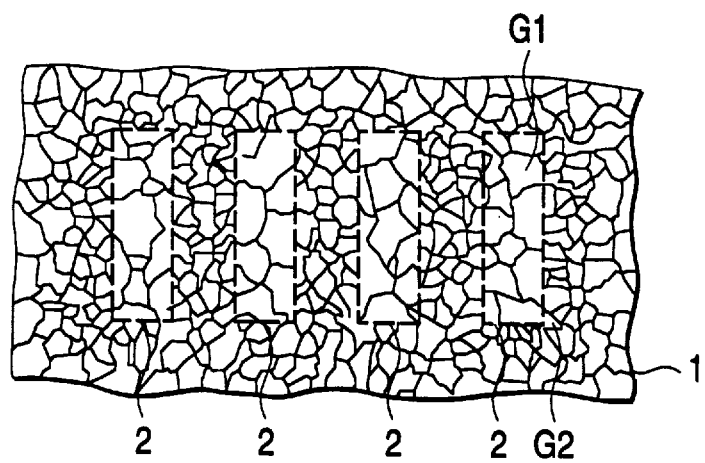
FIG. 3 is a plan view of a semiconductor device according to the first embodiment of the present invention after stacking of an aluminum alloy film is completed.

FIG. 3 is a plan view corresponding to FIG. 1 at the stage when stacking of the aluminum alloy is completed. As seen from FIG. 3, the aluminum alloy film is stacked on the resultant surface. Grains G1 of aluminum alloy formed on the alignment mark 2 have a large diameter of several μms, whereas grains G2 of aluminum alloy formed on the line patterns 3 has a diameter of 0.5–2.0 μm at most which will not become the same size as that of the alignment mark 2.

Where no pattern is formed on the periphery of the alignment mark 2 as in the prior art, the grains of aluminum alloy are also formed on the alignment mark 2 and on the semiconductor substrate 1 on its periphery. If the size of the grain formed on the periphery of the alignment mark 2 reaches several μms, this grain is erroneously recognized as the alignment mark 2, thus making it impossible to recognize accurate alignment.

However, according to this embodiment, the minute line patterns 3 are formed on the periphery of the alignment mark 2 so that when the film of aluminum or its alloy is made by the high temperature sputtering, the grains formed on the line patterns 3 having a size larger than the pitch of the line patterns 3 will not be created.

Thus, the grains formed on periphery of the alignment mark 2 according to this embodiment have a diameter of 0.5–2,0 μm at most. Unlike the grains formed on the flat portion with no pattern, they will not grow so as to have a large diameter of several μm. As a result, the grains created will not be erroneously recognized as the alignment mark 2, thereby permitting accurate mask alignment.

Incidentally, although the alignment marks 2 and line patterns 3 are shown to have concave patterns, they may have convex patterns. In this case also, it is possible to suppress grains from growing on the line patterns 3 formed on the periphery of the alignment mark 2, thus realizing accurate alignment.

Embodiment 2

An explanation will be given of the second embodiment according to the present invention.

Figure 4:
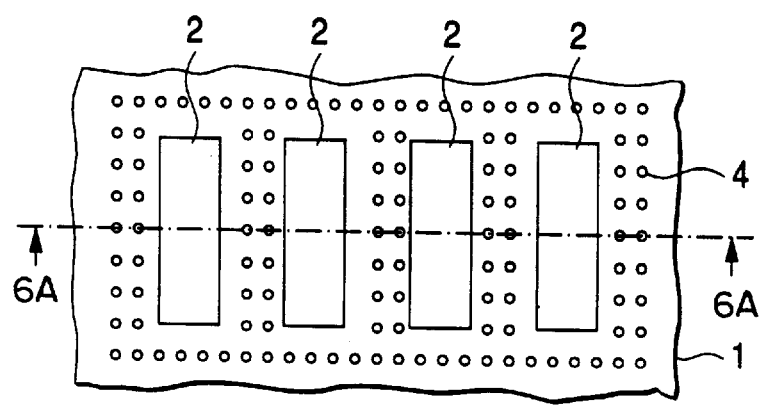
FIG. 4 is a plan view of a semiconductor device according to the second embodiment of the present invention.

In the first embodiment of the present invention, the line patterns 3 were formed on the periphery of each of the alignment marks 2. On the other hand, in this embodiment, as shown in FIG. 4, in place of the line patterns 3, concave holes patterns 4 each having a diameter of 0.5–2.0 μm are formed on the periphery of each of the main alignment marks 2. These hole patterns 4 are formed with pitches of 0.5–2.0 μm.

Figure 5:
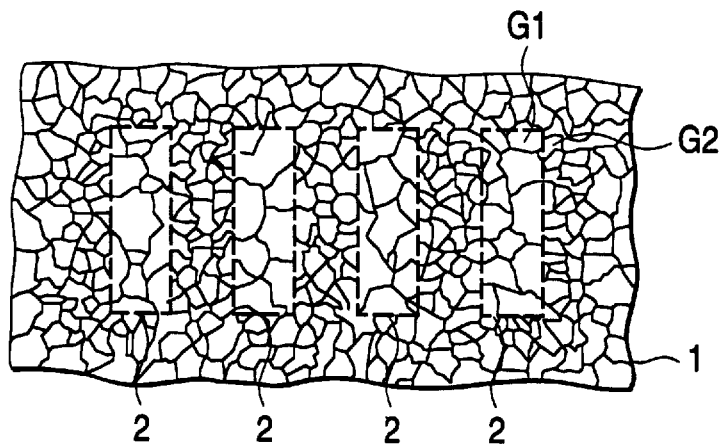
FIG. 5 is a plan view of a semiconductor device according to the second embodiment of the present invention after stacking of an aluminum alloy film is completed.

On a pattern with the alignment patterns 2 and the hole patterns 4 as shown in FIG. 4, a film of aluminum alloy is formed by the high temperature sputtering as in the first embodiment. In this case, as shown in FIG. 5, grains G1 each having a large diameter of several μm are created on the alignment mark 2, whereas grains G2 each having a diameter of 0.5–2.0 μm or less, which is a pitch of the hole patterns 4, are formed on the periphery of the alignment mark 2 where the hole patterns 4 are formed.

Figure 6A:
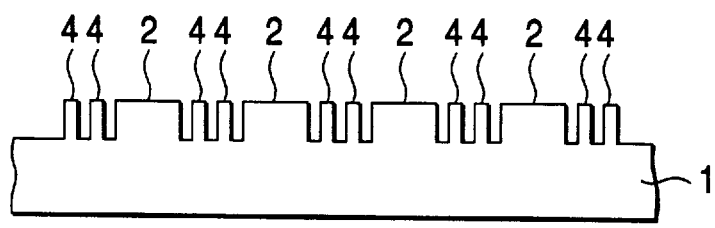
FIGS. 6A and 6B are plan views of a semiconductor device according to the second embodiment of the present invention, respectively.
Figure 6B:
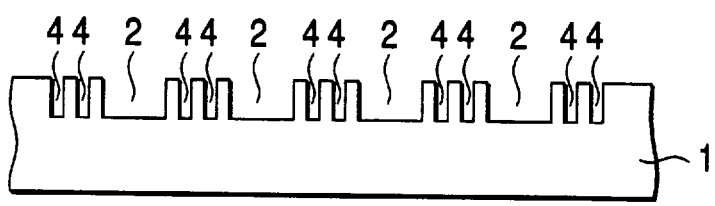
Figure 7:
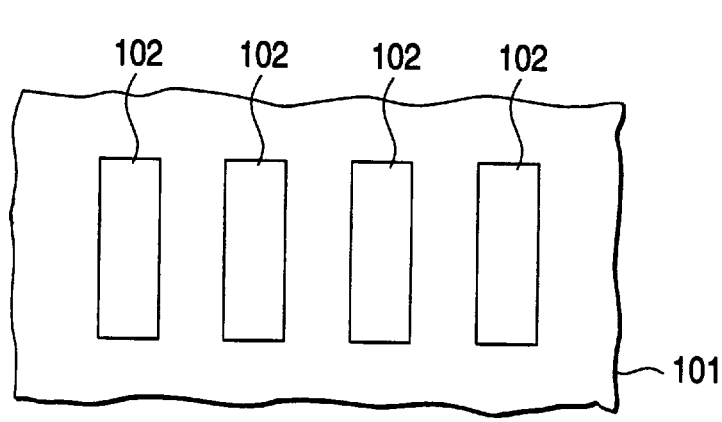
FIGS. 7 to 9 are views showing the prior arts, respectively.
Figure 8:
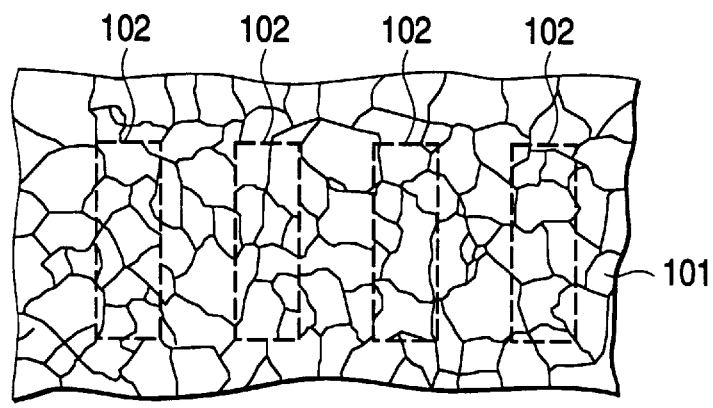
Figure 9:
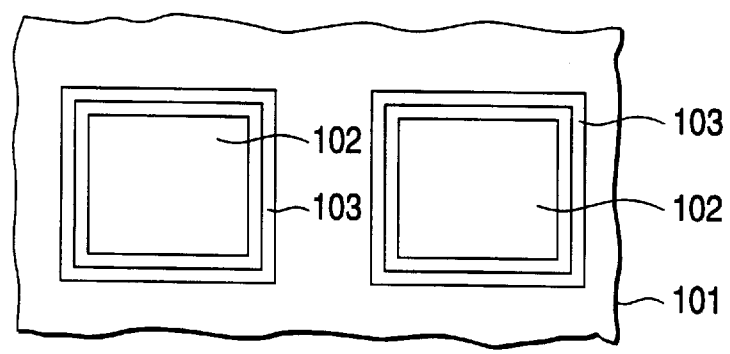

For this reason, the grains which are grown on the periphery of the alignment mark 2 by the subsequent alignment step will not be erroneously recognized as the alignment mark 2, thereby realizing accurate alignment.

Where the alignment mark 2 and the hole patterns 4 on the periphery thereof are formed as convex patterns, the section taken on line 6A—6A of FIG. 4 is as shown in FIG. 6A. The alignment marks 2 and the hole patterns 4 may be formed as concave patterns. In this case, the section taken on line 6A—6A as shown in FIG. 6B.

Further, the alignment marks 2 and the hole patterns 4 may be formed as convex patterns and concave patterns, respectively, and vice versa. In either case, in the alignment step successive to stacking of the aluminum alloy film by the high temperature sputtering, the alignment mark 2 can be recognized accurately, thereby realizing accurate mask alignment.

In both the first and second embodiments, although the alignment mark 2 was formed in a quadrilateral, it may be formed in a combination (+ shape, L-shape, etc.) of graphics such as an ellipse, circle, line having a predetermined thickness. In these cases also, if the minute patterns such as the line patterns 3 or hole patterns 4 are formed on the periphery of the alignment pattern 2, accurate alignment can be made, thereby realizing accurate mask alignment. Correction of the arrangement of chips can be made accurately.

Further, the shape of the minute patterns formed on the periphery of the alignment pattern 2 should not be limited to the line patterns 3 and the hole patterns 4, but may be any other patterns as long as these patterns each having a diameter or width of 0.5–2.0 μm are arranged with pitches of 0.5–2.0 μm, thereby permitting the alignment mark 2 to be accurately detected.

What is claimed is:

1. A semiconductor device having alignment marks formed on a semiconductor substrate, said alignment marks comprising:

a main alignment mark formed on the semiconductor substrate; and minute alignment marks located on the outer periphery of the main alignment mark such that the growth of grains on the minute alignment marks is suppressed.

2. A semiconductor device having alignment marks formed on a semiconductor substrate, said alignment marks comprising:

a main alignment mark formed on said semiconductor substrate in at least one of convex and concave shapes; and a plurality of minute alignment marks located on the periphery of the main alignment mark such that the growth of grains on the minute alignment marks is suppressed.

3. A semiconductor device according to claim 2, wherein each of said minute alignment marks has at least one of concave and convex shape, and one of a hole pattern and line-and-space pattern.

4. A semiconductor device according to claim 2, wherein said main alignment mark is a quadrilateral pattern having sides of at least 2.0 μm in length, and each of said minute alignment marks has a length of 0.5–2.0 μm and is also formed as a hole or line pattern formed so that the interval between two adjacent minute alignment marks is 0.5–2.0 μm.

5. A semiconductor device according to claim 2, wherein said plurality of minute alignment marks is formed so as to surround outer peripheral four sides of said main alignment mark having a quadrilateral shape.

6. A semiconductor device according to claim 2 further comprising at least one of aluminum film and aluminum alloy film formed by a high temperature sputtering method.

7. A semiconductor device having alignment marks formed on a semiconductor substrate, said alignment marks comprising:

a main alignment mark formed on the semiconductor substrate, said main alignment mark having a width; and a plurality of minute alignment marks located on the outer periphery of the main alignment marks, each of said plurality of minute alignment marks having a width differing from the width of said main alignment mark.

8. A semiconductor device having alignment marks formed on a semiconductor substrate, said alignment marks comprising:

a plurality of elongated main alignment marks formed on the semiconductor substrate in a parallel arrangement; and a plurality of minute alignment marks extending laterally from on the outer periphery of at least one of said main alignment marks so as to form a lattice shaped configuration with said plurality of elongated main alignment marks.

* * * * *